(12) United States Patent
Lu

(10) Patent No.: US 12,302,554 B2
(45) Date of Patent: *May 13, 2025

(54) UNIFIED MICRO SYSTEM WITH MEMORY INTEGRATED CIRCUIT AND LOGIC INTEGRATED CIRCUIT

(71) Applicants: Etron Technology, Inc., Hsinchu (TW); Invention And Collaboration Laboratory Pte. Ltd., Singapore (SG)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 18/530,185

(22) Filed: Dec. 5, 2023

(65) Prior Publication Data
US 2024/0114678 A1    Apr. 4, 2024

Related U.S. Application Data

(63) Continuation of application No. 17/894,184, filed on Aug. 24, 2022, now Pat. No. 11,877,439, which is a
(Continued)

(51) Int. Cl.
*G11C 5/04*    (2006.01)
*G11C 5/02*    (2006.01)
(Continued)

(52) U.S. Cl.
CPC ............ *H10B 12/36* (2023.02); *G11C 5/025* (2013.01); *H01L 25/0657* (2013.01); *H10D 88/00* (2025.01)

(58) Field of Classification Search
CPC ..... H10B 12/36; G11C 5/025; H01L 25/0657; H01L 27/0688
(Continued)

(56) References Cited

U.S. PATENT DOCUMENTS 4,873,205 A    10/1989    Critchlow
4,877,750 A    10/1989    Okumura
(Continued)

FOREIGN PATENT DOCUMENTS

CN           1450653      10/2003
CN         101908543 A    12/2010
(Continued)

*Primary Examiner* — Huan Hoang
(74) *Attorney, Agent, or Firm* — Winston Hsu

(57) ABSTRACT

An IC system includes a package, a plurality of memory dies, and a logic chip. The plurality of memory dies are within the package, each memory die includes a memory region and a bridge area, the memory region of each memory die includes a plurality of memory cells and each memory cell includes a first transistor, and the bridge area of each memory die includes a plurality of memory input/output (I/O) pads and a plurality of third transistors. The logic chip includes a logic bridge area and a plurality of second transistors, and the logic bridge area includes a plurality of logic I/O pads. Each memory die is horizontally spaced apart from the logic chip, and the plurality of memory I/O pads of each memory die are electrically coupled to the plurality of logic I/O pads. Each memory die is horizontally spaced apart from each other.

17 Claims, 5 Drawing Sheets

Related U.S. Application Data continuation of application No. 17/189,270, filed on Mar. 2, 2021, now Pat. No. 11,456,300, which is a continuation of application No. 16/708,442, filed on Dec. 10, 2019, now Pat. No. 10,971,499.

(60) Provisional application No. 62/777,254, filed on Dec. 10, 2018, provisional application No. 62/824,315, filed on Mar. 27, 2019, provisional application No. 62/848,553, filed on May 15, 2019.

(51) Int. Cl.
  *H01L 25/065* (2023.01)
  *H10B 12/00* (2023.01)
  *H10D 88/00* (2025.01)

(58) Field of Classification Search
  USPC ........................................................ 365/149
  See application file for complete search history.

(56) References Cited

U.S. PATENT DOCUMENTS

| | | | |
|---|---|---|---|
| 5,874,757 | A | 2/1999 | Chao |
| 9,048,339 | B2 | 6/2015 | Cheng |
| 9,530,851 | B1 | 12/2016 | Lu et al. |
| 9,553,173 | B1 | 1/2017 | Lam et al. |
| 10,971,499 | B2 | 4/2021 | Lu |
| 11,456,300 | B2 | 9/2022 | Lu |
| 11,877,439 | B2 * | 1/2024 | Lu ................... H01L 25/18 |
| 2001/0025993 | A1 | 10/2001 | Inoue |
| 2001/0046766 | A1 | 11/2001 | Asakawa |
| 2004/0125652 | A1 | 7/2004 | Hsu |
| 2004/0184327 | A1 | 9/2004 | Okuda |
| 2005/0145952 | A1 | 7/2005 | Gonzalez |
| 2006/0131657 | A1 | 6/2006 | Hamaguchi |
| 2008/0195894 | A1 | 8/2008 | Schreck |
| 2009/0001468 | A1 | 1/2009 | Shin |
| 2009/0075029 | A1 | 3/2009 | Thomas |
| 2010/0081244 | A1 | 4/2010 | Papageorgiou |
| 2010/0246152 | A1 | 9/2010 | Lin |
| 2011/0117732 | A1 | 5/2011 | Bauer |
| 2012/0091469 | A1 | 4/2012 | Park |
| 2012/0104514 | A1 | 5/2012 | Park |
| 2013/0052809 | A1 | 2/2013 | Tung |
| 2013/0146957 | A1 | 6/2013 | Cheng |
| 2013/0285155 | A1 | 10/2013 | Glass et al. |
| 2014/0084350 | A1 | 3/2014 | Kim |
| 2014/0193960 | A1 | 7/2014 | Fukuda |
| 2015/0236157 | A1 | 8/2015 | Kwok |
| 2016/0056290 | A1 | 2/2016 | Tsai et al. |
| 2016/0204106 | A1 | 7/2016 | You |
| 2017/0373148 | A1 | 12/2017 | Cheng |
| 2018/0122956 | A1 | 5/2018 | Richter |
| 2018/0286981 | A1 | 10/2018 | Jang |
| 2018/0315851 | A1 | 11/2018 | Huang |
| 2019/0051641 | A1 | 2/2019 | Lee |
| 2019/0053406 | A1 | 2/2019 | Tezuka |
| 2020/0126882 | A1 | 4/2020 | Jang |
| 2020/0335593 | A1 | 10/2020 | Lu |

FOREIGN PATENT DOCUMENTS

| | | |
|---|---|---|
| CN | 104037226 | 9/2014 |
| CN | 104064467 | 9/2014 |
| CN | 108695389 A | 10/2018 |
| CN | 111223934 A | 6/2020 |
| CN | 111696987 A | 9/2020 |
| JP | 2000-31425 A | 1/2000 |
| JP | 2015-522948 A | 8/2015 |
| KR | 10-2012-0038195 A | 4/2012 |
| KR | 10-2014-0038826 A | 3/2014 |
| KR | 10-2015-0096300 A | 8/2015 |
| WO | 99/25025 A1 | 5/1999 |

* cited by examiner

UNIFIED MICRO SYSTEM WITH MEMORY INTEGRATED CIRCUIT AND LOGIC INTEGRATED CIRCUIT

CROSS REFERENCE TO RELATED APPLICATIONS

This application is a continuation application of U.S. application Ser. No. 17/894,184, filed on Aug. 24, 2022, which is a continuation application of U.S. application Ser. No. 17/189,270, filed on Mar. 2, 2021, which is a continuation application of U.S. application Ser. No. 16/708,442, filed on Dec. 10, 2019, which claims the benefit of U.S. Provisional Application No. 62/777,254, filed on Dec. 10, 2018, and claims the benefit of U.S. Provisional Application No. 62/824,315, filed on Mar. 27, 2019, and claims the benefit of U.S. Provisional Application No. 62/848,553, filed on May 15, 2019. The contents of these applications are incorporated herein by reference.

BACKGROUND OF THE INVENTION

1. Field of the Invention

The present invention relates to an unified micro system with memory IC and logic IC, and particularly to an unified IC system and a related DRAM chip thereof that include high performance logic 3D-shaped transistors, such as fin-structured transistors or gate around-structured transistors.

2. Description of the Prior Art

An IC system for high performance computing or artificial intelligence (AI) system is conventionally composed of a plurality of DRAM chips and a logic chip. The logic chip now could be made in silicon die by using a 10-nanometers process node, or a 7-nanometers process node and toward a 5-nanometers process node. These process nodes basically follow the Moore's Law by device scaling design to increase 2 times of transistors in a specified area per each process node. But the key contribution to be able to follow the Moore's Law is due to the invention and execution of 3D transistor structures (e.g. gate around, Tri-gate or FINFET). The 3D shaped or structured transistor does deliver high performance, low leakage and high reliability, etc.

On the other hand the DRAM technology scaling was slowed down after 45 nanometer process node and the introduction of 1X nm after the 25 nanometer process node takes much longer than the two years per process node which did happen in the DRAM history following the Moore's Law's prediction. A key reason is that the DRAM's using stacked capacitor structure which needs high temperature processing steps after the transistor structure has been formed and thus the transistor's source and drain junctions are hard to be controlled as shallow as the transistor scaling rules require. As a result, most DRAM technologies do not use the tri-gate transistor structure which has well been used in the Logic process for sub-20 nanometer process nodes and accelerates the necessary circuit-performance enhancement and achieves good leakage controllability and allows the power-supply voltage being scaled down from 1.2 Volts to 0.6-0.7 Volts. In addition, building up the stacked capacitor structure after the transistor formation really adds a lot of difficulties to use the Tri-gate or FINFET transistor structure. The ending result is that the DRAM scaling is getting harder to be scaled down below 15 nanometer and the sub-10 nanometer process node is not yet available.

When the Logic/SOC performance can be highly accelerated by sub-10 nanometer processing and design technologies, especially due to the use and improvement of the 3D Tri-gate transistor structures, the slowed-down DRAM technology migration makes the worse well-known Memory-Wall effect (actually DRAM-Wall) which reduces the data transfer rate between logic and memory. The data bandwidth and random access time are both getting a larger and larger performance gap: the conventional DRAM just cannot perform as a memory vehicle to provide or to store data to the Logic/SOC chip.

In order to solve the memory-wall problem, the DRAM technology development is led to a 3D-DRAM technology called high-bandwidth DRAM (HBM). However, in the HBM standard published by the Joint Electron Device Engineering Council (JEDEC), a supply voltage of the each DRAM chip is defined at 1.2V. However, a supply voltage of the tri-gate transistor used in the logic chip is at 0.6 to 0.7V. An incompatibility of the supply voltages between the each DRAM chip and the logic chip leads to difficulties in optimization of the energy efficiency and performance synchronization. Moreover, HBM uses 3D technologies of stacking multiple DRAMs (2, 4 or 8 dices) and each DRAM may have its capacity over 8 or 16 Gb and its IO paths wider than 1K and the total data rate using DDR3 can be over 128 GB/sec. The most difficult challenge is these 1K IOs need to be vertically connected by thousands of TSV (Through Silicon Via) connectors which challenges the final yield of HBM and thus its high cost in addition to very long manufacturing time. On the other hand, another solution of the memory-wall problem was also proposed to build up a DRAM cell with tri-gate access transistor as disclosed in U.S. Pat. No. 9,935,109, however, leakage issue for such a DRAM cell was not addressed therein.

SUMMARY OF THE INVENTION

An embodiment of the present invention provides an IC system. The IC system includes a package, a plurality of memory dies, and a logic chip. The plurality of memory dies are within the package, each memory die includes a memory region and abridge area, the memory region of each memory die includes a plurality of memory cells and each memory cell includes a first transistor, and the bridge area of each memory die includes a plurality of memory input/output (I/O) pads and a plurality of third transistors. The logic chip is physically separated from the plurality of memory dies and within the package, the logic chip includes a logic bridge area and a plurality of second transistors, and the logic bridge area includes a plurality of logic I/O pads. The plurality of memory dies and the logic chip are configured above a substrate, each memory die is horizontally spaced apart from the logic chip, and the plurality of memory I/O pads of each memory die are electrically coupled to the plurality of logic I/O pads. Each memory die is horizontally spaced apart from each other.

According to one aspect of the invention, the plurality of memory dies surround the logic chip, and the plurality of memory dies include four memory dies, and each memory die is adjacent to one side of the logic chip.

According to one aspect of the invention, a voltage level of a supply voltage to each of the plurality of memory dies is the same or substantially the same as a voltage level of another supply voltage to the logic chip.

According to one aspect of the invention, a voltage level of a signal to or from the third transistor is the same or substantially the same as a voltage level of a signal to or from the second transistor.

According to one aspect of the invention, each memory die does not include a voltage translation circuit or an off-chip driver.

According to one aspect of the invention, the memory I/O pads do not include an electrostatic discharge (ESD) protection circuit.

According to one aspect of the invention, a 3D structure of the third transistor is the same or substantially the same as a 3D structure of the second transistor.

Another embodiment of the present invention provides an IC system. The IC system includes a DRAM chip, a plurality of DRAM cells, and a logic chip. Each DRAM cell includes a first transistor, a capacitor, and a DRAM controlling bridge area. The DRAM controlling bridge area includes a plurality of DRAM input/output (I/O) pads and a plurality of third transistors. The logic chip is physically space apart from the DRAM chip and includes a plurality of second transistors and a logic bridge area. The logic bridge area includes a plurality of logic I/O pads, and the plurality of DRAM I/O pads are electrically coupled to the plurality of logic I/O pads. The DRAM chip includes a plurality of memory regions, each memory region includes a corresponding portion of the plurality of DRAM cells and a plurality of bidirectional repeaters. The plurality of memory regions are arranged in horizontal sequence, and each memory region is horizontally space apart from each other.

According to one aspect of the invention, the DRAM chip is a single chip scribed with a plurality of memory dies, and the plurality of memory dies are corresponding to the plurality of memory regions, respectively.

According to one aspect of the invention, each memory die includes a plurality of row address pads, and a plurality of column address pads are independent from the plurality of row address pads.

According to one aspect of the invention, each memory die further includes a set of control or command pads.

According to one aspect of the invention, each memory die includes a plurality of memory pads, each memory pad does not include an electrostatic discharge (ESD) protection circuit.

According to one aspect of the invention, the plurality of memory pads are configured for testing.

According to one aspect of the invention, each of the plurality of DRAM I/O pads does not include an electrostatic discharge (ESD) protection circuit.

According to one aspect of the invention, the DRAM chip does not include a voltage-translation circuit or an off chip drivers.

According to one aspect of the invention, the plurality of memory dies include a first memory die and a second memory die, the DRAM chip further includes a plurality of external bidirectional repeaters in the DRAM controlling bridge area, wherein a bidirectional repeater of the second memory die is electrically coupled to a corresponding bidirectional repeater of the first memory die through a second metal line, and the corresponding bidirectional repeater of the first memory die is electrically coupled to a corresponding external bidirectional repeater of the DRAM chip through a first metal line, and the corresponding external bidirectional repeater of the DRAM chip is electrically coupled to a corresponding DRAM I/O pad through a third metal line.

According to one aspect of the invention, the plurality of memory dies include a first memory die and a second memory die, the DRAM chip further includes a plurality of external bidirectional repeaters in the DRAM controlling bridge area, wherein a bidirectional repeater of the first memory chip is electrically coupled to a corresponding external bidirectional repeater of the DRAM chip through a first metal line, a bidirectional repeater of the second memory die is electrically coupled to the corresponding external bidirectional repeater of the DRAM chip through a second metal line, and the corresponding external bidirectional repeater of the DRAM chip is electrically coupled to a corresponding DRAM I/O pad through a third metal line.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
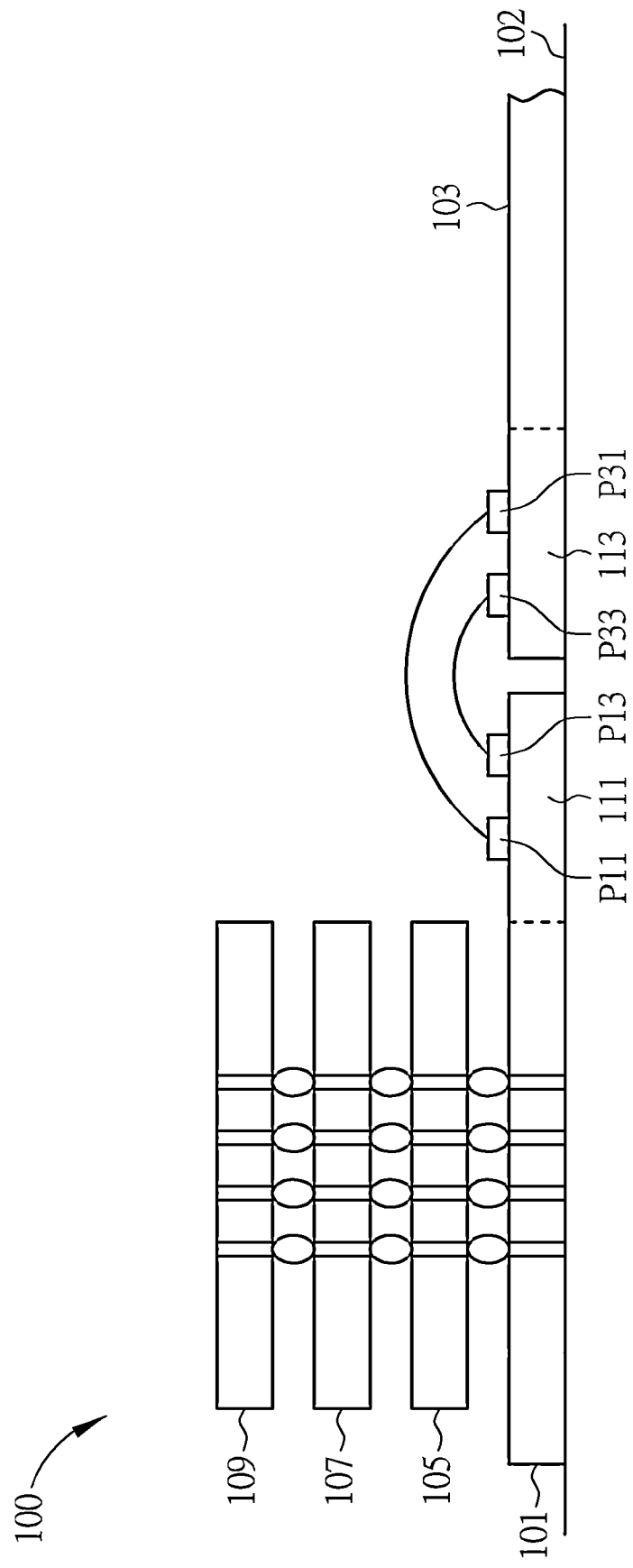
FIG. 1A is a diagram illustrating an unified IC system according to a first embodiment of the present invention.

Please refer to FIG. 1A. FIG. 1A is a diagram illustrating an unified micro system with memory IC and logic IC (hereinafter "unified IC system") 100 according to an embodiment of the present invention. As shown in FIG. 1A, the unified IC system 100 includes a base memory IC 101 and a logic IC 103, wherein the base memory IC 101 could be a DRAM chip, SRAM chip, flash chip or other data storage chip, and the logic IC 103 could be an Artificial Intelligence ("AI") IC, and in the following the logic IC 103 is a logic chip. Using DRAM chip as example, in FIG. 1A both of the base DRAM chip 101 and the logic chip 103 are configured above another substrate 102, wherein the base memory chip is not vertically apart from the logic chip, and the base DRAM chip 101 is physically separated from the logic chip 103. In addition, additional DRAM chips 105, 107, 109 could be stacked on the base DRAM chip 101 through a plurality of TSV. However, the present invention is not limited to the three stacked DRAM chips 105, 107, 109 being stacked on the base DRAM chip 101, and those stacked DRAM chips 105, 107, 109 could be other types of data storage chips. That is, a plurality of memory chips can be stacked on the base DRAM chip 101.

The base DRAM chip 101 includes a DRAM core with a plurality of DRAM cells (not shown in FIG. 1A) and a DRAM bridge area 111 which may include part or all peripheral circuits of the base DRAM chip 101. Each DRAM cell includes a first transistor and a capacitor, and the DRAM bridge area 111 could include a plurality of third transistors. The DRAM bridge area 111 could include control circuits (such as SerDes circuits or transitional circuits), I/O circuits, and I/O pads (like I/O pads P11 and P13) for the signals transmitted/received between the base DRAM chip 101 and the logic chip 103, and those control circuits and I/O pads are not necessary in the stacked DRAM chips 105, 107, 109. Of course, each of stacked DRAM chips 105, 107, 109 includes a DRAM core with a plurality of DRAM cells, and each DRAM cell again includes a first transistor and a capacitor. The stacked DRAM chip could further include few or part of peripheral circuits for communicating with other stacked DRAM chips and/or the base DRAM chip 101.

In another embodiment of the present invention, the DRAM bridge area 111 further includes testing circuits and error-correcting code (ECC) circuits (not shown in FIG. 1A). Operation methods of the testing circuits and the ECC circuits are well-known to those of ordinary skill in the art, so further descriptions thereof are omitted for simplicity. The first transistor (or the third transistor) could be a 3D shaped transistor (e.g. fin-structured or gate around transistor) or a planar transistor. It is preferred that both the first and the third transistor are fin-structured transistors.

The logic chip 103 includes a plurality of second transistors (not shown in FIG. 1A) and a logic bridge area 113. The second transistor could be a fin-structured transistor or a planar transistor, and could be located inside and/or outside the logic bridge area 113. The logic bridge area 113 includes a plurality of logic I/O pads, like I/O pads P31 and P33. In addition, in one embodiment a structure of the third fin-structured transistor is the same or substantially the same as a structure of the second fin-structured transistor. As a result, the voltage level of an input signal of the third fin-structured transistor in the DRAM bridge area is the same or substantially the same as the voltage level of an input signal of the second fin-structured transistor in the logic bridge area, and the voltage level of an output signal of the third fin-structured transistor is the same or substantially the same as the voltage level of an output signal of the second fin-structured transistor. Therefore, the DRAM I/O pads P11, P13 can be electrically coupled to the logic I/O pads P31, P33 without additional voltage conversion circuit in the DRAM bridge area and/or the logic bridge area. The coupling could be made by metal wires, metal bridges, flip-chip, micro-bump, or other bonding technologies proposed in chiplets standards. Therefore, the base DRAM chip 101 can directly receive/output data or signals from/into the logic chip 103. As a result, the data processing, data flow and data storage in the advanced unified IC system can behave like a unified waveform to flow forward and back very smoothly in a continuous WAVEFLOW process with a much reduced Memory-Wall and can achieve even such a seamless data flow back-and-forth data platform.

Moreover, in another embodiment, the first transistor in the DRAM cell could be the fin-structured transistor and a structure of the first fin-structured transistor is the same or substantially the same as a structure of the third fin-structured transistor in DRAM bridge area. Furthermore, in further another embodiment, the structure of the first fin-structured transistor is just similar to the structure of the third fin-structured transistor in DRAM bridge area, such that the voltage level of an input/output signal of the third fin-structured transistor in the DRAM bridge area is the same or substantially the same as the voltage level of an input/output signal of the first fin-structured transistor in the DRAM cell, but the current leakage of the first fin-structured transistor in the DRAM cell is lower than that of the third fin-structured transistor in a DRAM bridge area. The first fin-structured transistor with lower current leakage will be illustrated later.

In addition, as shown in FIG. 1A, both the base DRAM chip 101 and the logic chip 103 can be placed on the substrate 102 and then enclosed in a single package. However, in another embodiment of the present invention, the base DRAM chip 101 and the logic chip 103 can be place on an interposer layer or an integrated fan-out mechanical structure, wherein operation methods of the interposer layer and the integrated fan-out mechanical structure are well-known to those of ordinary skill in the art, so further descriptions thereof are omitted for simplicity. In addition, the DRAM I/O pads P11, P13 and the logic I/O pads P31, P33 can be arranged on one edge of the DRAM bridge area 111 and one edge of the logic bridge area 113 respectively to shorten communication paths between the DRAM I/O pads P11, P13 and the logic I/O pads P31, P33. In another embodiment of the present invention, the DRAM bridge area 111 and the logic bridge area 113 can be placed as close as possible to make a gap between the DRAM bridge area 111 and the logic bridge area 113 be substantially seamless (or less than a predetermined distance).

Figure 1B:
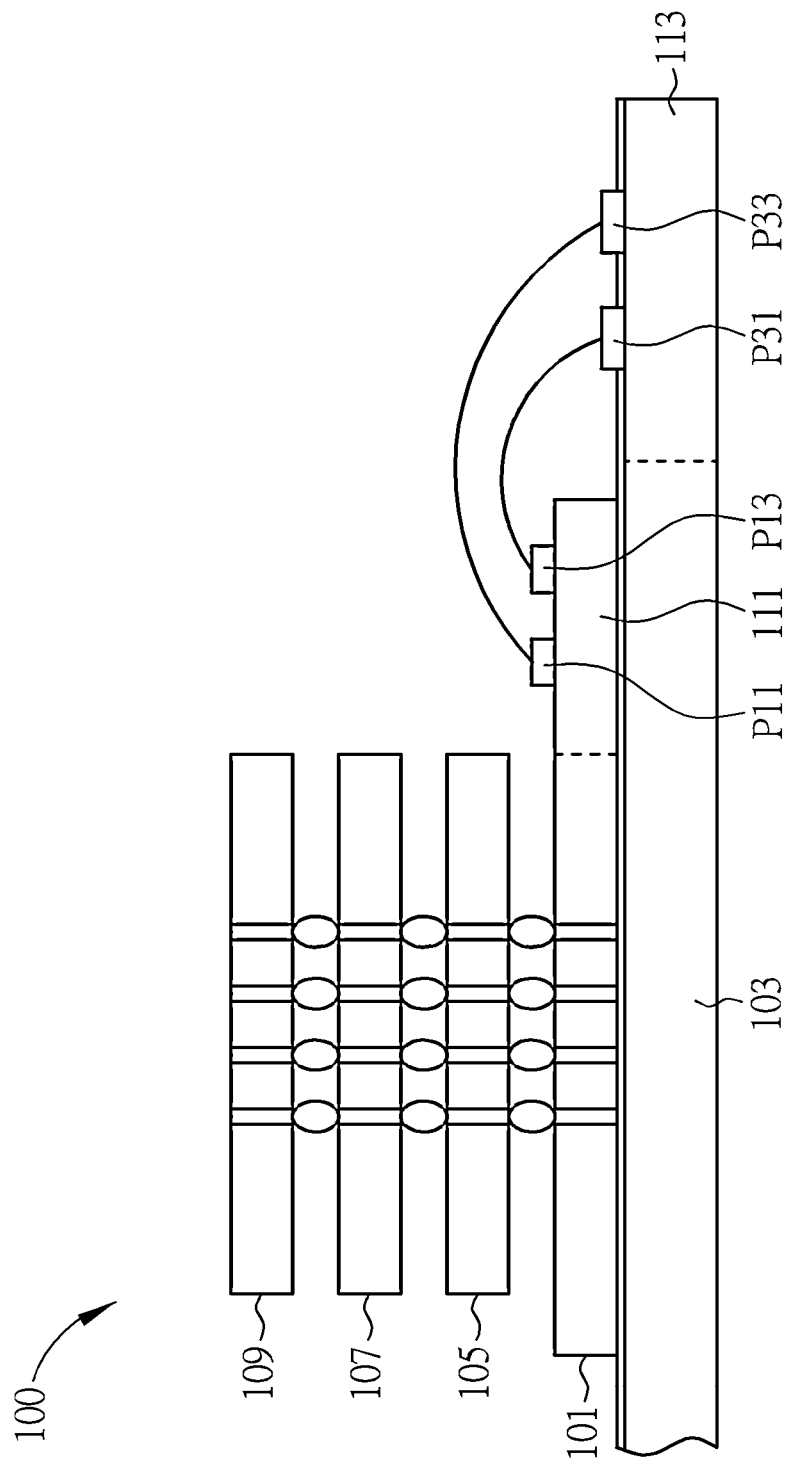
FIG. 1B is a diagram illustrating another unified IC system according to a first embodiment of the present invention.

As shown in FIG. 1B, in another embodiment the base DRAM chip 101 is positioned on the logic chip 103, and the DRAM I/O pads (such as P11, P13) can be electrically coupled to the logic I/O pads (such as P31, P33) without additional voltage conversion circuit in the DRAM bridge area and/or the logic bridge area. As described, the coupling between the DRAM I/O pads and the logic I/O pads could be made by metal wires, metal bridges, flip-chip, micro-bump, or other bonding technologies, rather than aforesaid TSV. However, additional DRAM chips 105, 107, 109 could still be stacked on the base DRAM chip 101 through a plurality of TSV.

Therefore, the embodiment described in FIG. 1A and/or FIG. 1B discloses the following: (1) For a discrete Logic (or SOC) chip to interact and transfer data in and out of a discrete DRAM chip or HBM-type DRAM stacked chips, all the circuits located on both Logic/SOC chips and DRAM/HBM chips mainly have and primarily use the same transistor structures as made in the available logic process (such as Tri-gate or FINFET or GAA transistor design) without adopting the transistor structures of DRAM/HBM existing in today's DRAM/HBM products (such as planar or trench transistor design). (2) For a discrete Logic/SOC chip to interact and transfer data in and out of a Discrete DRAM or HBM-type DRAM stacked chips, all the interface I/O circuits located on both Logic/SOC chips and DRAM/HBM chips solely have and only use the same transistor structures as made in the available logic process (such as Tri-gate or FINFET or GAA transistor design) without adopting the transistor structures of DRAM/HBM existing in today's DRAM/HBM products (such as planar or trench transistor design). (3) The DRAM cell adopts the most widely used 3D transistor structures used in Logic Process from 10 nanometer down to 7 nanometer or most likely 5 nanometer process nodes or below (such as Tri-gate, or FINFET, or GAA transistor structures, or other transistors which has a 3D structure). The fin-structured transistor hereinafter includes Tri-gate, or FINFET, GAA transistor structures, or other transistors which has the fin-structure.

Figure 2:
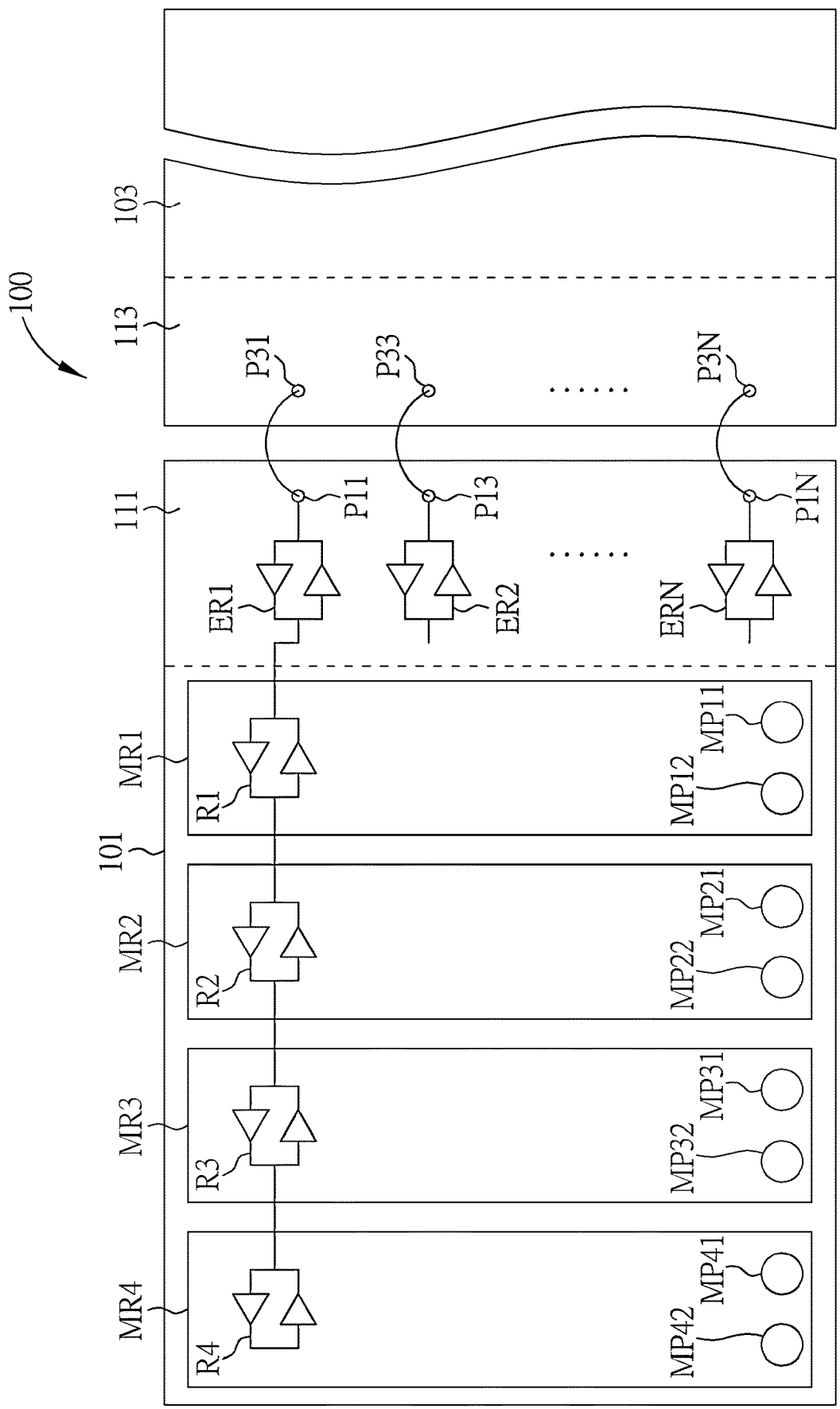
FIG. 2 is a diagram illustrating a coupling relationship of the base DRAM chip and the logic bridge area according to another embodiment of the present invention.

Please refer to FIG. 2. FIG. 2 is a diagram illustrating a coupling relationship of one base DRAM chip 101 and the logic bridge area 113 of the logic chip 103 according to another embodiment of the present invention. The base DRAM chip 101 includes multiple DRAM regions MR1 to MR4, and each DRAM region has multiple data read/written therefrom/therein. Unlike FIG. 1A, no DRAM chips are stacked above the base DRAM chip 101 in FIG. 2. That is, HBM defined by JEDEC which uses 3D technologies of stacking multiple DRAMs (2, 4 or 8 dices) vertically by thousands of TSV (Through Silicon Via) are not used in FIG. 2. Therefore, one memory region is not vertically separate from the other memory region. This new memory architecture of base DRAM chip 101 in FIG. 2 further allows a super-fast random access time of selecting every bit within such a High-Bandwidth DRAM die (HBD) in such a several Gigabyte capacity (i.e. Very short Latency of selecting each bit out of such capacity HBD) and provides a much shorter assembling time of various granularities of HBDs to effectively reduce the time-to-market of new logic/AI chip+DRAM products and results in a shorter design cycle and less manufacturing times and efforts. Such new HBD is a one-single-die HBD scribed from multiple such dice on a silicon wafer, and could also be referred as Complete Cascade RAM (CCRAM) hereinafter.

As shown in FIG. 2, the logic bridge area 113 of a logic/SOC chip includes logic I/O pads P31, P33 . . . P3N, wherein the logic I/O pads P31, P33 . . . P3N are coupled to DRAM I/O pads P11, P13 . . . PIN of the base DRAM chip (or HBD, CCRAM) 101, respectively, wherein N is a positive integer greater than 3. The DRAM I/O pads P11, P13 . . . PIN located in DRAM bridge area 111 of the base DRAM chip 101 are further coupled to external bidirectional repeaters ER1, ER2 . . . ERN in the DRAM bridge area 111 through metal lines to transmit and amplify data or signals. In addition, the base DRAM chip 101 is further divided into four memory regions MR1, MR2, MR3, and MR4. Each memory region has the same or substantially the same structure. For example, the memory region MR1 includes a plurality of first DRAM cells (not shown in FIG. 2), bidirectional repeaters or drivers R1 corresponding to the plurality of first DRAM cells, and micro pads MP11, MP12. Similarly, other memory region, such as MR2, includes a plurality of second DRAM cells (not shown in FIG. 2), bidirectional repeaters or drivers corresponding to the plurality of second DRAM cells, and micro pads, etc. However, the present invention is not limited to the base DRAM chip 101 being divided into the memory regions MR1, MR2, MR3, MR4 and each of the memory regions MR1, MR2, MR3, MR4 including one bidirectional repeater.

In another embodiment, each memory region has row address I/O pads (or interface) and column address I/O pads (or interface) physically independent from the row address I/O pads. Such non-multiplexing mode of using a parallel access path of activating both row address and column address could be used in this invention.

As previously mentioned, this base DRAM chip 101 is a complete cascade RAM (CCRAM) which is a one-single-die HBD scribed from multiple such dice on a silicon wafer. A CCRAM could include multiple on-die memory regions (such as MR1, MR2, MR3, MR4 in FIG. 2) and each memory region could also be named as Cascade RAM # (CRAM #) like CRAM1, CRAM2, CRAM3 and CRAM4 to be used as an example. Each CRAM #is a memory unit which uses DRAM's 1T1C cell structure with a special design of (1) both ultra-low-leakage-current access transistor and storage capacitor such as the leakage level below 1 femtoAmpere per cell, (2) an access mode on activating both row and column data selection paths without multiplexing like a conventional packaged DRAM (which needs to reduces the number of pins to save cost and to fit into certain package types) and this is just more like the SRAM access mode, (3) using the highest performance 3D Logic Transistors as accessible at this time, e.g. High mobility FinFET transistor, double-gate or Tri-gate FET, or the like, for peripheral devices outside the cell array rather than using either the slower-performance DRAM or even planar transistor, (4) Using the fourth, fifth or even sixth layer of metal interconnection in addition to the only three layers of metals which are usually used in today's DRAMs, that is, the DRAM cell used here must have a smooth surface topography which results in smooth planar surfaces for making multiple high-performance interconnects, (5) each CRAM #has its own complete testing and probing structures to verify the functionality, yield and performance but uses only smaller probe pads since these pads are not connected to the environment outside the chip and have no need to include ESD protection areas which are not small, (6) each CRAM #has employed its own need for completing the RAM operations such as row and address inputs, READ and WRITE command inputs, necessary clock and control signal locations and IOs, and now it's very important all these signals can be connected to the controlling locations (as shown on the DRAM bridge area 111 of the CCRAM 101 in FIG. 2 as example) by their own bilateral repeaters or drivers with high-performance transistors and high conductances of metal interconnections widely used in the logic technologies, and (7) since both logic and CCRAM are using the same FinFET or Tri-gate transistors as the building components for receivers and transmitters, there are no need for complex voltage-translation circuits and thus no need for off-chip drivers (OCDs) and the transmission of signals from logic die to CCRAM die and vice versa which thus has very natural impedance matching without complicated waveform reflection effects. Making such high performance of a HBM-like DRAM die, without using TSVs, can potentially reach over 1 to 2 TeraBytes/sec of the total data rate.

The bidirectional repeater R1 in memory region MR1 is coupled to the external bidirectional repeater ER1 through a metal line; the bidirectional repeater R2 is coupled to the bidirectional repeater R1 through the metal line; the bidirectional repeater R3 is coupled to the bidirectional repeater R2 through the metal line; and the bidirectional repeater R4 is coupled to the bidirectional repeater R3 through the metal line. A selection or control signal could be additionally applied to the bidirectional repeater ER1 and/or the bidirectional repeater R1-R4 for data selection. In addition, operation methods of other external bidirectional repeaters ER2 . . . ERN are similar to the above-mentioned operation method of the external bidirectional repeaters ER1, so FIG. 2 does not show coupling relationships thereof, and further descriptions thereof are omitted for simplicity.

The operation of the logic chip+CCRAM subsystem as shown in FIG. 2 is stated in the following. For example, the logic die 103 sends all the essential signals through its own IO pads P31-P3N (as in a general terminology mean all related signal pads), very similar signal paths as defined by JEDEC for HBMs can be referred to except that these HBMs needs to use TSVs to connect all the signals/IOs but the CCRAM has no needs of using TSVs and is using all proven repeaters/drivers circuits with high-performance transistors and interconnected high-conductance wires to complete the work. Because like the TSV connections used by HBMs some of the signal/IO paths are connected together, the operation for receiving and transmitting signals is needed to have controlling signals in FIG. 2 to decide which signal from MR1, MR2, MR3 and MR4 will be loaded and really received or transmitted. In addition, because transistors on the logic die 103 and CCRAM die 101 are using the same or similar FinFET or Tri-gate-FET or the like (as discussed in the aforesaid description of FIG. 1A) and the voltage levels are of the same values, the transceivers are quite straight-forward made on either die and there is no need for the interposer or Logic-memory translator die to significantly reducing the cost and form-factors.

Figure 3:
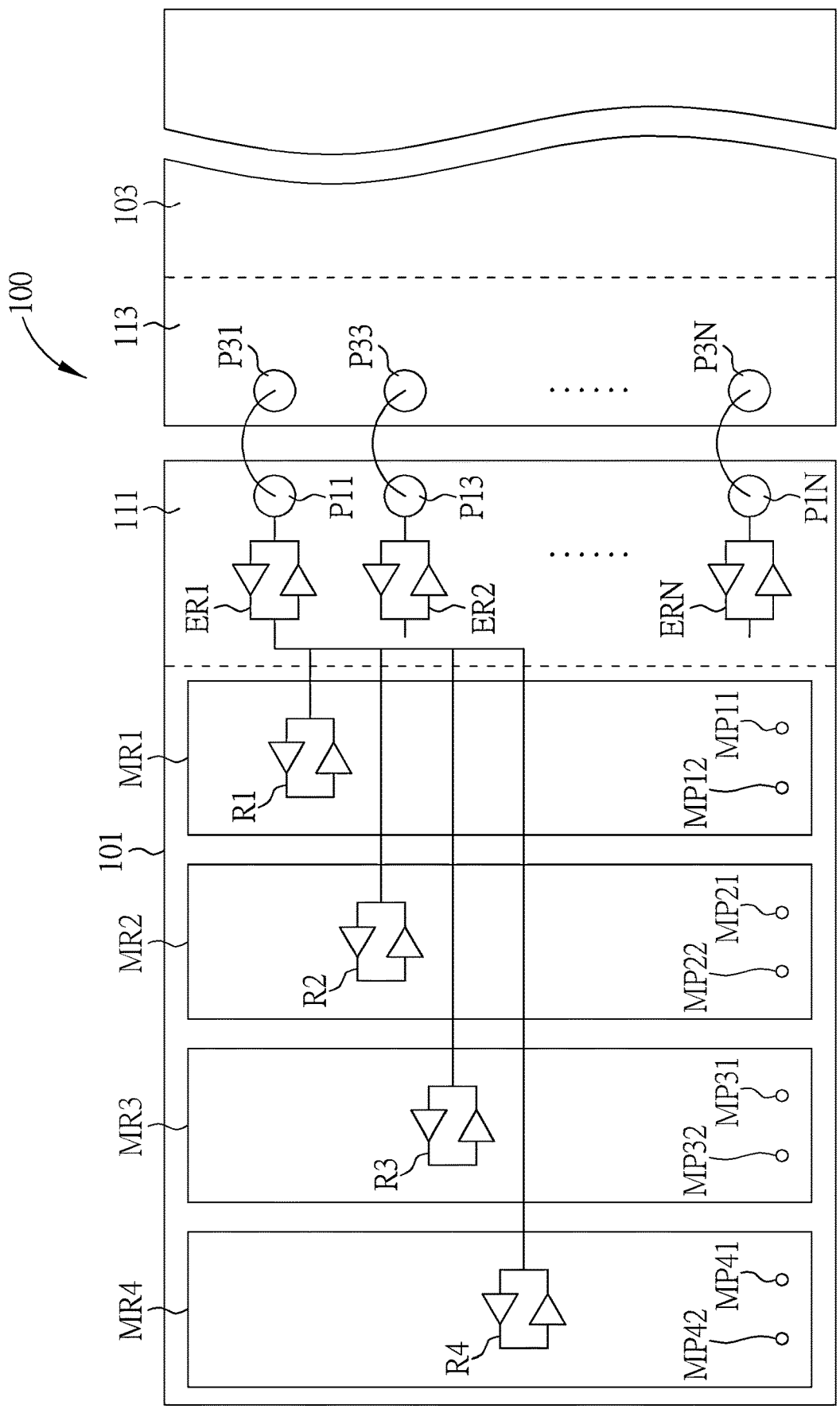
FIG. 3 is a diagram illustrating a coupling relationship of the base DRAM chip and the logic bridge area according to another embodiment of the present invention.

In addition, in another embodiment of the logic chip+ CCRAM subsystem as shown in FIG. 3, each bidirectional repeater of the bidirectional repeaters R1, R2, R3, R4 is directly coupled to the external bidirectional repeater ER1. Specifically, the bidirectional repeater R1 is coupled to the external bidirectional repeater ER1 through a first metal line; the bidirectional repeater R2 is coupled to the external bidirectional repeater ER1 through a second metal line; the bidirectional repeater R3 is coupled to the external bidirectional repeater ER1 through a third metal line; and the bidirectional repeater R4 is coupled to the external bidirectional repeater ER1 through a fourth metal line. A selecting circuit could be coupled to the bidirectional repeater ER1 and/or the bidirectional repeater R1-R4 to selectively pick up the desired signals.

In addition, in another embodiment of the present invention, the bidirectional repeaters R1, R2, R3, R4 can be directly coupled to the DRAM I/O pad P11, that is, the external bidirectional repeaters ER1 . . . ERN as shown in FIG. 2 and FIG. 3 can be omitted.

In addition, the micro pads MP11, MP12 could be coupled to external probes (not shown in FIG. 2) for testing the plurality of first DRAM cells (e.g. verifying functionalities, yields and performances). In one embodiment, the micro pads MP11, MP12 are capable to be coupled to an environment outside the unified IC system 100 and have need to include conventional electrostatic discharge (ESD) protection circuits, a size of each of the micro pads MP11, MP12 is larger than that of each of the DRAM I/O pads P11, P13 . . . P1N which is configured to be coupled internally with logic chip 103, rather than externally with environment outside the unified IC system 100. Each memory region MR1-MR4 can include a plurality of micro pads, wherein a number of the plurality of micro pads is less than a number of the DRAM I/O pads P11, P13 . . . P1N in the DRAM bridge area 111.

However, the present invention is not limited to the above-mentioned, and in another embodiment, the micro pads MP11, MP12 does not include conventional electrostatic discharge (ESD) protection circuits, and a size of each of the micro pads MP11, MP12 is less than a size of each of the DRAM I/O pads P11, P13 . . . PIN which may or may not include ESD.

In another embodiment, four separate CCRAMs or base DRAM chips could be adjacent to four sides of the logic chip 103 respectively, that is, the logic chip 103 is surrounding by four CCRAM chips. The connections between one side of the logic chip 103 and one CCRAM chip could be the same as those described in FIG. 2 or FIG. 3. Further in another embodiment, the CCRAM chip could be stacked vertically above or below the logic chip 103 in a single package.

Figure 4:
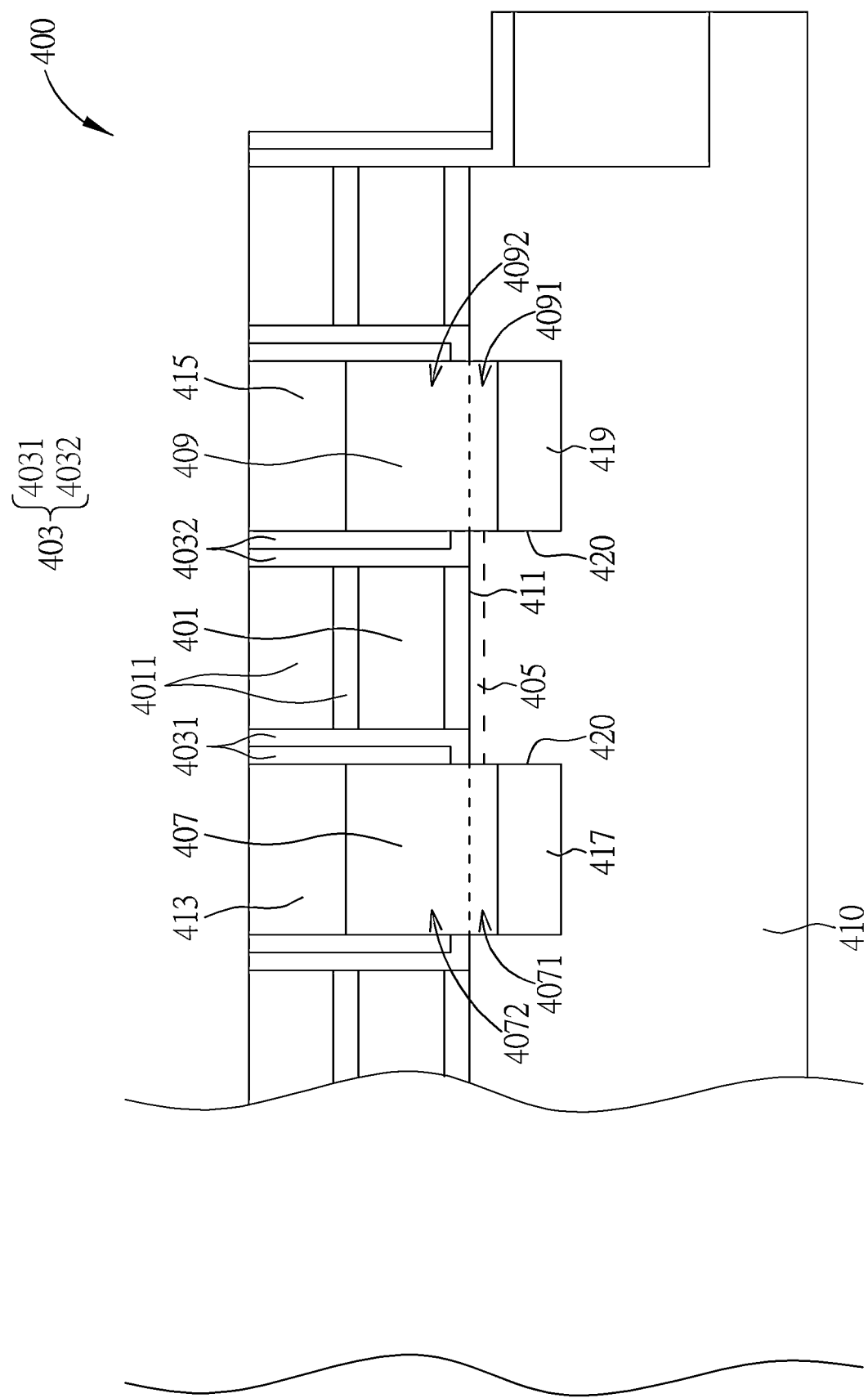
FIG. 4 is a diagram illustrating a fin-structured transistor according to a second embodiment of the present invention.

Please refer to FIG. 4. FIG. 4 is a diagram illustrating a transistor 400 according to an embodiment of the present invention. This transistor has lower current leakage and could be used as an access transistor in the DRAM cell of the base DRAM chip 101. As shown in FIG. 4, the transistor 400 includes a gate 401, a spacer 403, a channel region 405, a first conductive region 407, and a second conductive region 409. The gate 401 is formed above a silicon surface 411, wherein a cap structure 4011 can be formed on the gate 401. In one embodiment the silicon surface 411 could be the top surface of a fin structure of a substrate and the transistor 400 is a fin-structured transistor. In another embodiment, the transistor 400 could be a planar transistor and the silicon surface 411 is just the planar surface of the substrate. The spacer 403 is formed above the silicon surface 411 and includes a first part 4031 and a second part 4032, wherein the first part 4031 covers a left-sidewall of the gate 401, and the second part 4032 covers a right-sidewall of the gate 401. In addition, the spacer 403 can be a single-layer spacer, or a multiple-layer spacer (e.g. a nitride-oxide composite layer). The channel region 405 is formed under the gate 401 and the spacer 403, and the channel region 405 is aligned with the spacer 403. Because of the spacer 403, a length of the channel region 405 is larger than a length of the gate 401.

The first conductive region 407 and the second conductive region 409 are partially formed in two concaves 420 respectively and can be formed by using a selective epitaxy growth (SEG) or an atomic layer deposition (ALD) technique. In addition, the first conductive region 407 includes a lower part 4071 and an upper part 4072, wherein the lower part 4071 is below the silicon surface 411 and within one concave 420, and is coupled to the channel region 405. The upper part 4072 is above the silicon surface 411 and is coupled to the first part 4031. Similarly, the second conductive region 409 includes a lower part 4091 and an upper part 4092, wherein the lower part 4091 is below the silicon surface 411 and within another concave 420, and is coupled to the channel region 405. The upper part 4092 is above the silicon surface 411 and is coupled to the second part 4032. Therefore, the first conductive region 407 and the second conductive region 409 are separated from the gate 401 by the first part 4031 and the second part 4032 respectively to reduce a leakage current of the fin-structured transistor 400. In addition, a doping concentration of the upper part 4072 could be higher or lower than a doping concentration of the lower part 4071, and a doping concentration of the upper part 4092 could be higher or lower than a doping concentration of the lower part 4091. Moreover, in another embodiment of the present invention, each of the first conductive region 407 and the second conductive region 409 can further comprises a plurality of tiers, wherein a doping concentration profile of the plurality of tiers is controllable or variable from the bottom tier to the top tier during the formation. Therefore, resistances of the first conductive region 407 and the second conductive region 409 can be controlled through different doping concentration profiles therein. In addition, in another embodiment of the present invention, the resistances of the first conductive region 407 and the second conductive region 409 can be further controlled by selected heights, widths and lengths of the first conductive region 407 and the second conductive region 409.

In addition, two contact regions 413, 415 could be further formed on the first conductive region 407 and the second conductive region 409, respectively, wherein the contact regions 413, 415 are used for future interconnection. In addition, in another embodiment of the present invention, two insulation layers 417, 419 could be formed within the two concaves 420 respectively and under the lower parts 4071, 4091 to further reduce the leakage current of the transistor 400. In addition, in another embodiment of the present invention, the gate 401 can be formed deeper into the substrate 410 (such as buried gate structure) to make the length of the channel region 405 larger, wherein the gate 401 being formed deeper into the substrate 410 is well-known to those of ordinary skill in the art, so further description thereof is omitted for simplicity.

In another embodiment, each second fin-structured transistor of the logic chip 103 can be the fin-structured transistor or the transistor 400 shown in FIG. 4, and the third fin-structured transistor of DRAM bridge area 111 of the base DRAM chip 101 can be the fin-structured transistor or the transistor 400 in FIG. 4. Therefore, the voltage levels of the I/O signals of the base DRAM chip 101 and the logic chip 103 are compatible with each other, and the DRAM system 100 does not need to include a translational circuit for adjusting different voltages and signal levels. Moreover, a data processing, a data flow, and a data storage in the DRAM system 100 can behave like a unified waveform to flow forward and back very smoothly in a continuous waveflow process, and a memory wall problem can be reduced.

In other embodiment, the structure of the second transistor in the logic chip 103 is the fin-structured transistor currently available in the logic process for sub-20 nanometer process nodes, and is the same or substantially the same as that of the third fin-structured transistor of DRAM bridge area 111 of the base DRAM chip 101. But the structure of the first transistor in the DRAM cell is the fin-structured transistor 400 in FIG. 4 which is just similar to that of the second fin-structured transistor of logic chip 103, but the source/drain structures of the fin-structure transistor 400 is different from those of the second fin-structured transistor of logic chip 103. Nevertheless, the voltage levels of the I/O signals of the base DRAM chip 101 and the logic chip 103 are still compatible with each other, and the DRAM system 100 does not need to include a translational circuit for adjusting different voltages and signal levels.

Moreover, due to the lower leakage of the fin-structured transistor 400 shown in FIG. 4 utilized in the DRAM cell, the memory region could have refresh time over 64 ms. Furthermore, the capacitor of the DRAM cell in this invention could be stacked capacitor, trench capacitor, or vertical capacitor with two electrodes vertically extending along the normal direction of the silicon surface of the substrate, wherein one electrode of the capacitor is not above the other electrode of the capacitor.

To sum up, the present invention provides the unified IC system including a base DRAM chip and a logic chip. The base DRAM chip of the unified system includes a DRAM core with a plurality of DRAM cells and a DRAM bridge area. Each DRAM cell includes a first 3D structured transistor and a capacitor, and the DRAM bridge area includes a plurality of third fin-structured transistors and a plurality of memory I/O pads. The DRAM bridge area is majorly configured for the signal connection/transition between the base DRAM chip and the logic chip. The logic chip of the unified system includes a plurality of second fin-structured transistors. Additionally, a plurality of stacked DRAM chips are optionally positioned above the base DRAM chip, the plurality of stacked DRAM chips are electrically coupled to the base DRAM chip through a plurality of TSV, and each stacked DRAM chip, unlike the base DRAM chip, does not include a bridge area.

Because a voltage level of an I/O signal of the third fin-structured transistors is equal to a voltage level of an I/O signal of the second fin-structured transistor, the DRAM chip can be directly coupled to the logic chip. Therefore, compared to the prior art, the present invention can solve the memory wall problem, and voltage levels of I/O signals of the DRAM chip and the logic chip are compatible with each other.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. An IC (integrated circuit) system, comprising:
   a package;
   a plurality of memory dies within the package, each memory die comprising a memory region and a bridge area, the memory region of each memory die comprising a plurality of memory cells and each memory cell comprising a first transistor, and the bridge area of each memory die comprising a plurality of memory input/output (I/O) pads and a plurality of third transistors; and
   a logic chip physically separated from the plurality of memory dies and within the package, the logic chip comprising a logic bridge area and a plurality of second transistors, the logic bridge area comprising a plurality of logic I/O pads;
   wherein the plurality of memory dies and the logic chip are configured above a substrate, each memory die is horizontally spaced apart from the logic chip, and the plurality of memory I/O pads of each memory die are electrically coupled to the plurality of logic I/O pads;
   wherein each memory die is horizontally spaced apart from each other.

2. The IC system of claim 1, wherein the plurality of memory dies surround the logic chip, and the plurality of memory dies comprise four memory dies, and each memory die is adjacent to one side of the logic chip.

3. The IC system of claim 1, wherein a voltage level of a supply voltage to each of the plurality of memory dies is the same or substantially the same as a voltage level of another supply voltage to the logic chip.

4. The IC system of claim 3, wherein a voltage level of a signal to or from a third transistor is the same or substantially the same as a voltage level of a signal to or from a second transistor.

5. The IC system of claim 1, wherein each memory die does not comprise a voltage translation circuit or an off-chip driver.

6. The IC system of claim 1, wherein the memory I/O pads do not comprise an electrostatic discharge (ESD) protection circuit.

7. The IC system of claim 1, wherein a 3D structure of a third transistor is the same or substantially the same as a 3D structure of a second transistor.

8. A unified IC system, comprising:
   a DRAM chip comprising:
      a plurality of DRAM cells, wherein each DRAM cell comprises a first transistor and a capacitor; and
      a DRAM controlling bridge area comprising a plurality of DRAM input/output (I/O) pads and a plurality of third transistors; and
   a logic chip physically space apart from the DRAM chip, comprising:
      a plurality of second transistors; and
      a logic bridge area, wherein the logic bridge area comprises a plurality of logic I/O pads, and the plurality of DRAM I/O pads are electrically coupled to the plurality of logic I/O pads;
   wherein the DRAM chip comprises a plurality of memory regions, each memory region comprises a corresponding portion of the plurality of DRAM cells and a plurality of bidirectional repeaters;
   wherein the plurality of memory regions are arranged in horizontal sequence, and each memory region is horizontally space apart from each other.

9. The unified IC system of claim 8, wherein the DRAM chip is a single chip scribed with a plurality of memory dies, and the plurality of memory dies are corresponding to the plurality of memory regions, respectively.

10. The unified IC system of claim 9, wherein each memory die comprises a plurality of row address pads, and a plurality of column address pads are independent from the plurality of row address pads.

11. The unified IC system of claim 10, wherein each memory die further comprises a set of control or command pads.

12. The unified IC system of claim 9, wherein each memory die comprises a plurality of memory pads, each memory pad does not include an electrostatic discharge (ESD) protection circuit.

13. The unified IC system of claim 12, wherein the plurality of memory pads are configured for testing.

14. The unified IC system of claim 9, wherein each of the plurality of DRAM I/O pads does not comprise an electrostatic discharge (ESD) protection circuit.

15. The unified IC system of claim 9, wherein the DRAM chip does not comprise a voltage-translation circuit or an off chip drivers.

16. The unified IC system of claim 9, wherein the plurality of memory dies comprise a first memory die and a second memory die, the DRAM chip further comprises a plurality of external bidirectional repeaters in the DRAM controlling bridge area, wherein a bidirectional repeater of the second memory die is electrically coupled to a corresponding bidirectional repeater of the first memory die through a second metal line, and the corresponding bidirectional repeater of the first memory die is electrically coupled to a corresponding external bidirectional repeater of the DRAM chip through a first metal line, and the corresponding external bidirectional repeater of the DRAM chip is electrically coupled to a corresponding DRAM I/O pad through a third metal line.

17. The unified IC system of claim 9, wherein the plurality of memory dies comprise a first memory die and a second memory die, the DRAM chip further comprises a plurality of external bidirectional repeaters in the DRAM controlling bridge area, wherein a bidirectional repeater of the first memory chip is electrically coupled to a corresponding external bidirectional repeater of the DRAM chip through a first metal line, a bidirectional repeater of the second memory die is electrically coupled to the corresponding external bidirectional repeater of the DRAM chip through a second metal line, and the corresponding external bidirectional repeater of the DRAM chip is electrically coupled to a corresponding DRAM I/O pad through a third metal line.

* * * * *